United States Patent
Chan et al.

(10) Patent No.: US 9,343,178 B2
(45) Date of Patent: May 17, 2016

(54) GATE DRIVER AND SHIFT REGISTER

(71) Applicant: AU Optronics Corp., Hsin-Chu (TW)

(72) Inventors: Pin-Yu Chan, Hsin-Chu (TW); Chia-En Wu, Hsin-Chu (TW); Kai-Wei Hong, Hsin-Chu (TW); Li-Wei Liu, Hsin-Chu (TW); Yung-Chih Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/454,729

(22) Filed: Aug. 8, 2014

(65) Prior Publication Data

US 2015/0294734 A1 Oct. 15, 2015

(30) Foreign Application Priority Data

Apr. 10, 2014 (TW) .............................. 103113292 A

(51) Int. Cl.
*G11C 19/28* (2006.01)
*H03K 17/16* (2006.01)

(52) U.S. Cl.
CPC .............. *G11C 19/28* (2013.01); *H03K 17/161* (2013.01)

(58) Field of Classification Search
CPC .......... G09G 2230/00; G09G 2310/00; G09G 2310/04; G09G 2310/06; G09G 2310/067; G11C 19/00; G11C 19/28; H03K 17/00; H03K 17/161; H03K 19/00; H03K 19/00315; H03K 19/00361; H03K 19/00384; H04L 25/00; H04L 25/0272; H04L 25/028
USPC .......................................................... 327/108
See application file for complete search history.

(56) References Cited

U.S. PATENT DOCUMENTS

| | | | |
|---|---|---|---|
| 8,581,655 B2 | 11/2013 | Chen | |
| 2007/0217564 A1* | 9/2007 | Tobita | G11C 19/28 377/64 |
| 2009/0303211 A1* | 12/2009 | Hu | G11C 19/28 345/204 |
| 2010/0260312 A1* | 10/2010 | Tsai | G09G 3/3677 377/79 |

* cited by examiner

*Primary Examiner* — John Poos
*Assistant Examiner* — David Mattison
(74) *Attorney, Agent, or Firm* — Winston Hsu; Scott Margo

(57) ABSTRACT

A gate driver has a plurality of shift registers. Each of the shift registers has at least three input terminals, two signal input terminals, a pull-up circuit, a driving circuit, a stability pull-down control circuit, and a stability pull-down circuit. The three input terminals of each shift register receive three different clock signals. Accordingly, the driving circuit and the stability pull-down control circuit of each shift register are controlled according to the three clock signals, such that a glitch causing by the coupling effect of the parasitic capacitor of the driving circuit is avoided and the stability of the gate driver is improved.

15 Claims, 5 Drawing Sheets

GATE DRIVER AND SHIFT REGISTER

BACKGROUND OF THE INVENTION

1. Field of the Invention

The invention relates to a gate driver and shift register, and more particularly, to a gate driver and shift register that can suppress glitches caused by the coupling effect of parasitic capacitors of a transistor.

2. Description of the Prior Art

Generally, a display panel includes a plurality of pixels, at least one gate driver, and at least one source driver. The gate driver includes a plurality of stages of shift registers and is used to provide a plurality of gate driving signals for turning on and off the pixels. The source driver is used to write the data into the turned-on pixels.

FIG. 1 shows the shift register 100 according to prior art and FIG. 2 shows the timing diagram of the shift register 100 in FIG. 1. The shift register 100 is a bidirectional shift register, which includes switches T1A to T1G. The first terminal of the switch T1A receives the first selective control signal U2D, the second terminal of the switch T1A is coupled to the node $Q_N$, and the control terminal of the switch T1A receives the gate driving signal $G_{N-1}$. The first terminal of the switch T1B receives the second selective control signal D2U, the second terminal of the switch T1B is coupled to the node $Q_N$, and the control terminal of the switch T1B receives the gate driving signal $G_{N+1}$. The gate driving signal $G_{N-1}$ is the output signal of the shift register that is one stage prior to the shift register 100, and the gate driving signal $G_{N+1}$ is the output signal of the shift register that is one stage next to the shift register 100.

The first terminal of the switch T1C receives the clock signal CK. The second terminal of the switch T1C is coupled to the output terminal Out of the shift register 100 to output the gate driving signal $G_N$. The first terminal of the capacitor C1 is coupled to the node $Q_N$, and the second terminal of the capacitor C1 is coupled the output terminal OUT. The first terminal of the capacitor C2 receives the clock signal CK, the second terminal of the capacitor C2 is coupled to the node $P_N$. The first terminal of the switch T1D is coupled to the node $P_N$, the second terminal of the switch T1D is coupled to the system voltage terminal VSS, and the control terminal of the switch T1D is coupled to the node $Q_N$. The system voltage terminal VSS is used to provide the low gate voltage VGL. The switch T1D controls the electrical connection between the node $P_N$ and the low gate voltage VGL according to the voltage level of the node $Q_N$. The first terminals of the switches T1E and T1F are coupled to the node $Q_N$ and the output terminal Out of the shift register 100 respectively, and the second terminals of the switches T1E and T1F are both coupled to the system voltage terminal VSS. In addition, the control terminals of the switches T1E and T1F are coupled to the node $P_N$ so the switches T1E and T1F are turned on or turned off by control of the voltage level of the node $P_N$. Furthermore, the first terminal of the switch T1G is coupled to the output terminal Out of the shift register 100, the second terminal of the switch T1G is coupled to the system voltage terminal VSS, and the control end of the switch T1G receives another clock signal XCK. The voltage levels of the clock signal XCK and the clock signal CK switch between the high gate voltage VGH and low gate voltage VGL.

With the first selective control signal U2D at the high gate voltage VGH and the second selective control signal D2U at the low gate voltage VGL, during the period of T1 in FIG. 2, the gate driving signal $G_{N-1}$ is pulled up to the high gate voltage VGH, the switch T1A is turned on and the switch T1B is turned off so the voltage level of the node $Q_N$ is also pulled up to the high gate voltage VGH. Meanwhile, the switches T1C, T1D and T1G are also turned on because the voltage level of the node $Q_N$ and the clock signal XCK are at the high gate voltage VGH. However, since the clock signal CK is at low gate voltage VGL, the voltage levels of the gate driving signal $G_N$ and the node $P_N$ are kept at low gate voltage VGL. The switches T1E and T1F are turned off since the voltage level of the node $P_N$ is at low gate voltage.

During the period of T2 in FIG. 2, the gate driving signal $G_{N-1}$ is pulled down to the low gate voltage VGL, the clock signal CK is at the high gate voltage VGH, and the clock signal XCK is at the low gate voltage VGL. The switches T1A and T1B are turned off and the switch T1C is still turned on so the gate driving signal $G_N$ is pulled up to the high gate voltage VGH. The voltage level of the node $Q_N$ is raised to about two times of the high gate voltage VGH due to the coupling effect of the capacitor C1. The switch T1D is turned on so the voltage level of the node $P_N$ is kept at the low gate voltage VGL. Meanwhile, the switches T1E and T1F are turned off.

During the period of T3 in FIG. 2, the gate driving signal $G_{N-1}$ is still at the low gate voltage VGL, the gate driving signal $G_{N+1}$ is at the high gate voltage VGH, the clock signal CK is at the low gate voltage VGL, and the clock signal XCK is at the high gate voltage VGH. The switch T1A is turned off, and the switches T1B and are T1G are turned on. Since the switch T1B is turned on, the voltage level of the node $Q_N$ is pulled down to the same voltage level of the second selective control signal D2U (namely, the low gate voltage VGL). Also, the gate driving signal $G_N$ of the shift register 100 is pulled down to the low gate voltage VGL because the switch T1G is turned on. Since the voltage level of the node $Q_N$ is pulled down, the switches T1C and T1D are turned off. In addition, due to the clock signal CK, the voltage level of the node $P_N$ is pulled down to the low gate voltage VGL, which further turns off the switches T1E and T1F.

During the period of T4 in FIG. 2, the gate driving signals $G_{N-1}$ and $G_{N+1}$ are at the low gate voltage VGL, the clock signal CK is at the high gate voltage VGH, and the clock signal XCK is at the low gate voltage VGL. The switches T1A, T1B, T1C, T1D, and T1G are all turned off. However, due to the coupling effect caused by the parasitic capacitor of the switch T1C, a glitch P can be easily generated on the node $Q_N$. Although the voltage level of the node $Q_N$ can be pulled down by the switches T1E and T1F, the switches T1E and T1F may need a response time to be fully turned on and may not be able to suppress the glitch P effectively since the glitch P is generated instantly when the voltage level of the clock signal CK changes to the high gate voltage VGH. Under this situation, the waveform of the gate driving signal $G_N$ of the shift register 100 can be triggered by mistake and may further cause wrong charging of the pixels driven by the gate driving signal $G_N$.

SUMMARY OF THE INVENTION

One embodiment of the present invention discloses a shift register. The shift register comprises a first input terminal, a second input terminal, a third input terminal, a first input signal terminal, a second input signal terminal, a pull-up circuit, a driving circuit, a stability pull-down circuit, and a stability pull-down control circuit. The first input terminal receives a first clock signal, the second input terminal receives a second clock signal and the third input terminal receives a third clock signal. The first input signal terminal receives a first input signal, and the second input signal terminal receives a second input signal. The pull-up circuit is coupled to a first node, the first input signal terminal and the second input signal terminal for pulling up a voltage level of the first node according to the first input signal, the second input signal, a first selective control signal, and a second selective control signal. The driving circuit is coupled to the first input terminal, an output terminal of the shift register, and the first node for controlling an electrical connection between the first input terminal and the output terminal according to the voltage level of the first node. The stability pull-down control circuit comprises a first switch, a second switch, and a third switch. The first switch has a first terminal coupled to a second node of the shift register, a second terminal coupled to a system voltage terminal of the shift register, and a control terminal coupled to the first node. The second switch has a first terminal configured to receive the first selective control signal, a second terminal coupled to the second node, and a control terminal coupled to the second input terminal. The third switch has a first terminal configured to receive the second selective control signal, a second terminal coupled to the second node, and a control terminal coupled to the third input terminal. The stability pull-down circuit is coupled to the first node, the second node, the output terminal and the system voltage terminal for controlling an electrical connection between the first node and the output terminal and an electrical connection between the output terminal and the system voltage terminal according to a voltage level of the second node.

Another embodiment of the present invention discloses a gate driver. The gate driver has a plurality of shift registers and each shift register comprises a first input terminal, a second input terminal, a third input terminal, a first node, a second node, a first input signal terminal, a second input signal terminal, a system voltage terminal, a pull-up circuit, a driving circuit, a stability pull-down circuit, and a stability pull-down control circuit. The pull-up circuit is coupled to the first node, the first input signal terminal and the second input signal terminal for pulling up a voltage level of the first node according to a voltage level of the first input terminal signal terminal, a voltage level of the second input signal terminal, a first selective control signal, and a second selective control signal. The driving circuit is coupled to the first input terminal, an output terminal of the shift register, and the first node for controlling an electrical connection between the first input terminal and the output terminal according to the voltage level of the first node. The stability pull-down control circuit comprises a first switch, a second switch, and a third switch. The first switch has a first terminal coupled to a second node of the shift register, a second terminal coupled to the system voltage terminal of the shift register, and a control terminal coupled to the first node. The second switch has a first terminal configured to receive the first selective control signal, a second terminal coupled to the second node, and a control terminal coupled to the second input terminal. The third switch has a first terminal configured to receive the second selective control signal, a second terminal coupled to the second node, and a control terminal coupled to the third input terminal. The stability pull-down circuit is coupled to the first node, the second node, the output terminal and the system voltage terminal for controlling an electrical connection between the first node and the output terminal and an electrical connection between the output terminal and the system voltage terminal according to a voltage level of the second node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
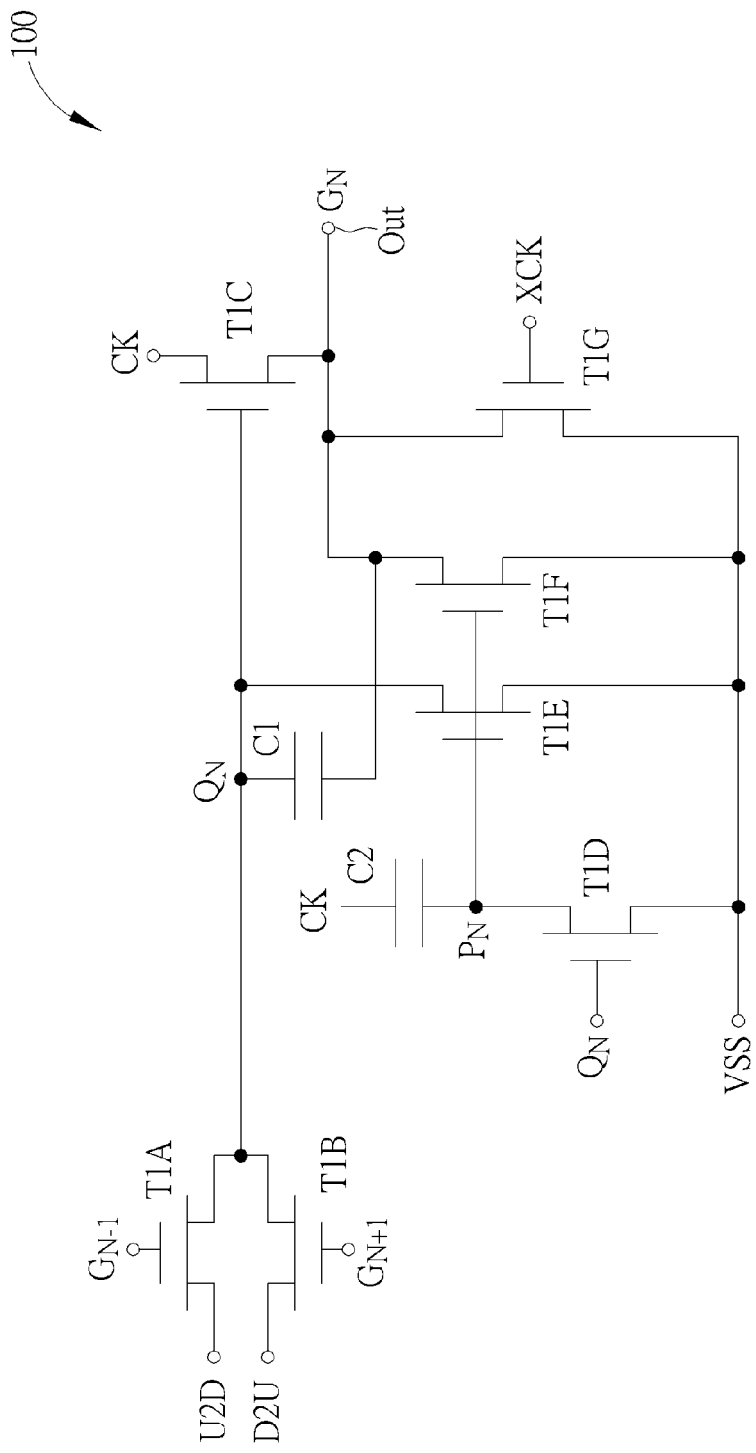
FIG. 1 shows a shift register according to the prior art.
Figure 2:
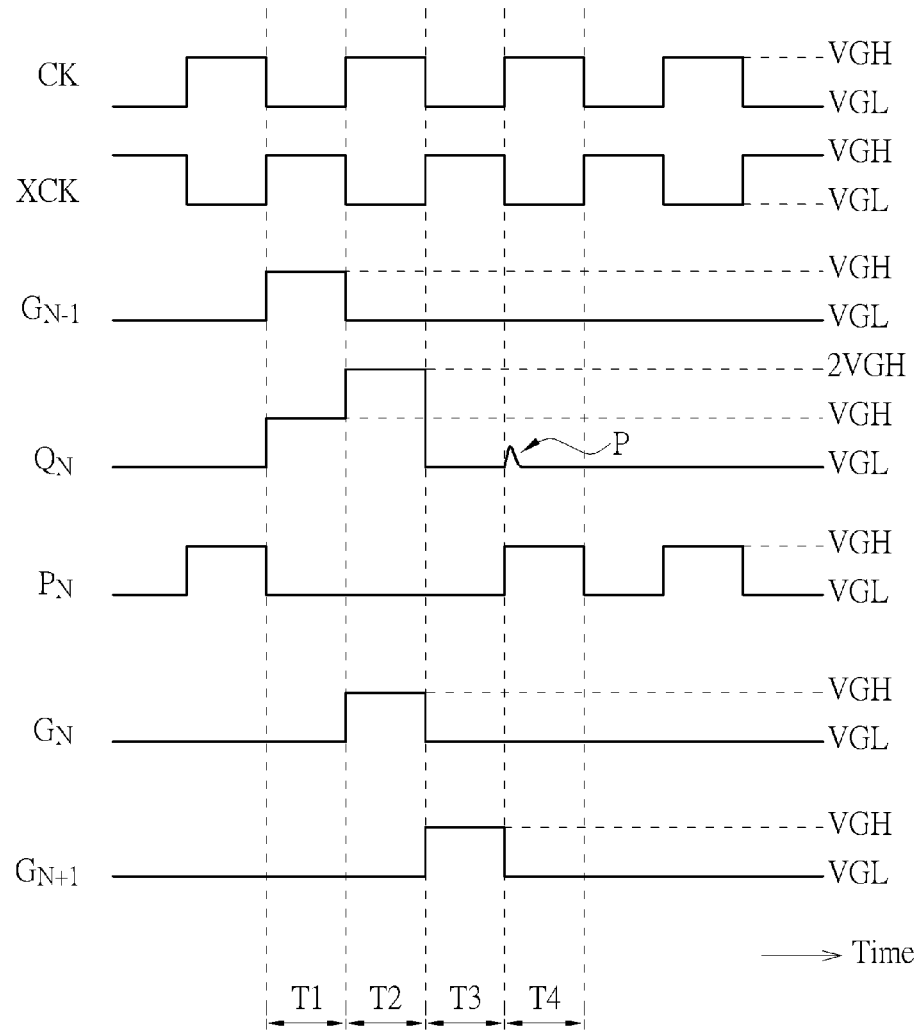
FIG. 2 shows a timing diagram of the shift register in FIG. 1.
Figure 3:
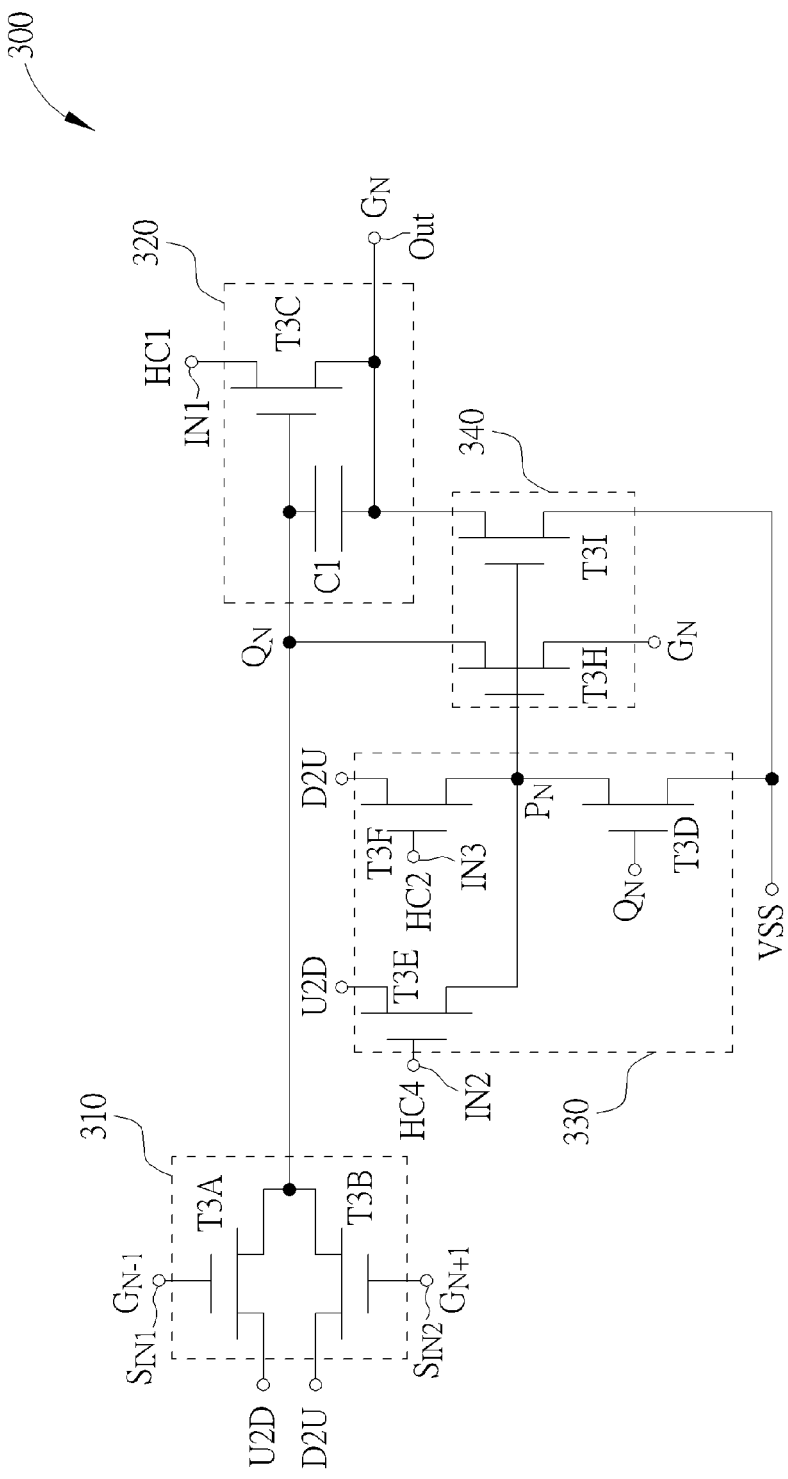
FIG. 3 shows a shift register according to one embodiment of the present invention.

FIG. 3 shows the shift register 300 according to one embodiment of the present invention. The shift register 300 comprises the first input terminal IN1, the second input terminal IN2, the third input terminal IN3, the first input signal terminal $S_{IN1}$, the second input signal terminal $S_{IN2}$, the pull-up circuit 310, the driving circuit 320, the stability pull-down control circuit 330, and the stability pull-down circuit 340. The first input terminal IN1, second input terminal IN2, and the third input terminal IN3 are used to receive the first clock signal HC1, HC4 and HC2 respectively. The first input signal terminal $S_{IN1}$ receives the first input signal $G_{N-1}$, and the second input signal terminal $S_{IN2}$ receives the second input signal $G_{N+1}$. Namely, the gate driving signals $G_{N-1}$ and $G_{N+1}$ are the input signals to the shift register 300 respectively. The gate driving signal $G_{N-1}$ is the output signal of the shift register that is one stage prior to the shift register 300, and the gate driving signal $G_{N+1}$ is the output signal of the shift register that is one stage next to the shift register 300.

The pull-up circuit 310 is coupled to the first node $Q_N$, and the first signal input terminal $S_{IN1}$, and is used for pulling up the voltage level of the first node $Q_N$ according to at least one of the gate driving signals $G_{N-1}$ and $G_{N+1}$ and at least one of the first selective control signal U2D and the second selective control signal D2U. The driving circuit 320 is coupled to the first input terminal IN1, the output terminal Out, and the first node $Q_N$ for controlling the electrical connection between the first input terminal IN1 and the output terminal Out according to the voltage level of the first node $Q_N$. The stability pull-down control circuit 330 is coupled to the second input terminal IN2, the first node $Q_N$, the second node $P_N$ and the system voltage terminal VSS, and is used for receiving the first selective control signal U2D and clock signal HC4 and controlling the voltage level of the second node $P_N$ according to the voltage level of the first node $Q_N$ and the clock signal HC4. The stability pull-down circuit 340 is coupled to the first node $Q_N$, the second node $P_N$, the output terminal Out and the system voltage terminal VSS for controlling the electrical connection between the first node $Q_N$ and the output terminal Out and the electrical connection between the output terminal Out and the system voltage terminal VSS according to the voltage level of the second node $P_N$.

In one embodiment of the present invention, the pull-up circuit 310 comprises the first selective switch T3A and the second selective switch T3B. The first selective switch T3A has a first terminal configured to receive the first selective control signal U2D, a second terminal coupled to the first node $Q_N$, and a control terminal coupled to the first input signal terminal $S_{IN1}$. The second selective switch T3B has a first terminal configured to receive the second selective control signal D2U, a second terminal coupled to the first node $Q_N$, and a control terminal coupled to the second input signal terminal $S_{IN2}$. The driving circuit 320 may comprise the switch T3C and the capacitor C1. The switch T3C has a first terminal coupled to the first input terminal IN1, a second terminal coupled to the output terminal Out, and a control terminal coupled to the first node $Q_N$. The capacitor C1 is coupled between the first node $Q_N$ and the output terminal Out. The stability pull-down control circuit 330 comprises the switches T3D, T3E, and T3F. The switch T3D has a first terminal coupled to the second node $P_N$, a second terminal coupled to the system voltage terminal VSS, and a control terminal coupled to the first node $Q_N$. The switch T3E has a first terminal configured to receive the first selective control signal U2D, a second terminal coupled to the second node $P_N$, and a control terminal coupled to the second input terminal IN2. The switch T3F has a first terminal configured to receive the second selective control signal D2U, a second terminal coupled to the second node $P_N$, and a control terminal coupled to the third input terminal IN3. In the same embodiment of the present invention, the stability pull-down circuit 340 comprises switches T3H and T3I. The switch T3H has a first terminal coupled to the first node $Q_N$, a second terminal coupled to the output terminal Out, and a control terminal coupled to the second node $P_N$. The switch T3I has a first terminal coupled to the output terminal Out, a second terminal coupled to the system voltage terminal VSS, and a control terminal coupled to the second node $P_N$.

Figure 4:
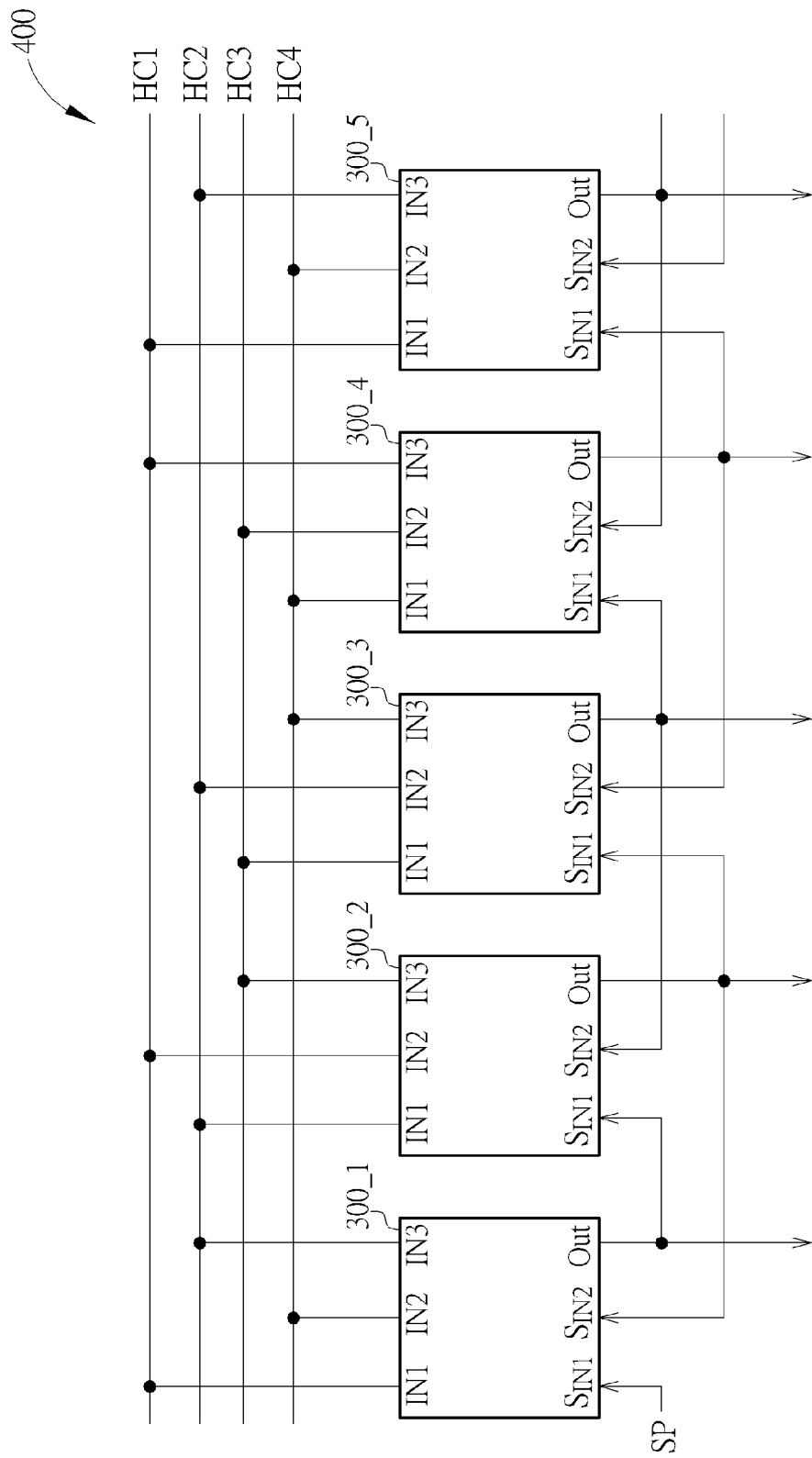
FIG. 4 shows a gate driver according to one embodiment of the present invention.

In one embodiment of the present invention, the shift register 300 can be used as a gate driver of a display panel. The gate driver can comprise a plurality of stages of the shift registers 300 for providing a plurality of gate driving signals to turn on and turn off the pixels of the display panel. FIG. 4 shows a gate driver 400 according to one embodiment of the present invention. The gate driver 400 comprises a plurality of shift registers 300 (for example, the shift registers 300_1 to 300_5). Each of the shift registers 300_1 to 300_5 has the same structure as has the shift register 300 in FIG. 3. Each of the shift registers 300_1 to $300_{13}$ 5 can output a gate driving signal $G_1$ to $G_5$ from its output terminal Out to the corresponding gate line (also called scan line) in turn for turning on the corresponding row of pixels in the display panel. The first input signal terminal $S_{IN1}$ of each of the shift registers 300_2 to 300_5 receives the gate driving signal $G_1$ to $G_4$ from the prior shift register 300_1 to 3004 respectively. The first input signal terminal $S_{IN1}$ of the shift register 300_1 receives an initial signal SP. In addition, the second input signal terminal $S_{IN2}$ of each of the shift registers 300_1 to 300_4 receives the gate driving signal $G_2$ to $G_5$ from the next shift register 300_2 to 300_5 respectively. The second input signal terminal $S_{IN2}$ of the shift register 300_5 also receives the gate driving signal outputted from the shift register next to the shift register 300_5. The first selective control signal U2D and the second selective control signal D2U are used to determine the output order of the shift registers 300_1 to 300_5 for outputting the gate driving signals $G_1$ to $G_5$ to the corresponding gate line. When the first selective control signal U2D is kept at the high gate voltage VGH and the second selective control signal D2U is kept at the low gate voltage VGL, the shift register 300_1 may output the gate driving signal $G_1$ firstly, and then the registers 300_2, 300_3, 300_4 can output the gate driving signal $G_2$, $G_3$, and $G_4$ in turn. The shift register $300_{13}$ 5 is the last shift register to output the driving signal $G_5$ among the five shift registers 300_1 to 300_5. Contrarily, when the first selective control signal U2D is kept at the low gate voltage VGL and the second selective control signal D2U is kept at the high gate voltage VGH, the shift register 300_5 may output the gate driving signal $G_5$ firstly, and then the registers 300_4, 300_3, 300_2 can output the gate driving signal $G_4$, $G_3$, and $G_2$ in turns. The shift register 300_1 is the last shift register to output the driving signal $G_1$ among the five shift registers 300_1 to 300_5.

Furthermore, the first input terminal IN1, the second input terminal IN2, and the third input terminal IN3 of each of the shift registers 300_1 and the 300_5 receive the clock signals HC1, HC4 and HC2. The first input terminal IN1, the second input terminal IN2, and the third input terminal IN3 of the shift register 300_2 receive the clock signals HC2, HC1 and HC3 respectively. The first input terminal IN1, the second input terminal IN2, and the third input terminal IN3 of the shift register 300_3 receive the clock signals HC3, HC2 and HC4 respectively. The first input terminal IN1, the second input terminal IN2, and the third input terminal IN3 of the shift register 300_4 receive the clock signals HC4, HC3 and HC1 respectively. The voltage levels of the clock signals HC1, HC2, HC3 and HC4 are switching between the high gate voltage VGH and the low gate voltage VGL. In one embodiment of the present invention, the high gate voltage VGH is 20 volt and the low gate voltage VGL is −8 volt. However, the present invention is not limited to the aforesaid example.

Also, the clock signals received by the three input terminals IN1 to IN3 of the $N^{th}$ shift register in the gate driver 400 are the same as the clock signals received by the three input terminals IN1 to IN3 of the $(N+4)^{th}$ shift register in the gate driver 400, wherein N is a positive integer. For example, the first input terminal IN1, the second input terminal IN2, and the third input terminal IN3 of the first shift register 300_1 receive the clock signals HC1, HC4, and HC2 respectively, and the first input terminal IN1, the second input terminal IN2, and the third input terminal IN3 of the first shift register 300_5 also receive the clock signals HC1, HC4, and HC2.

Figure 5:
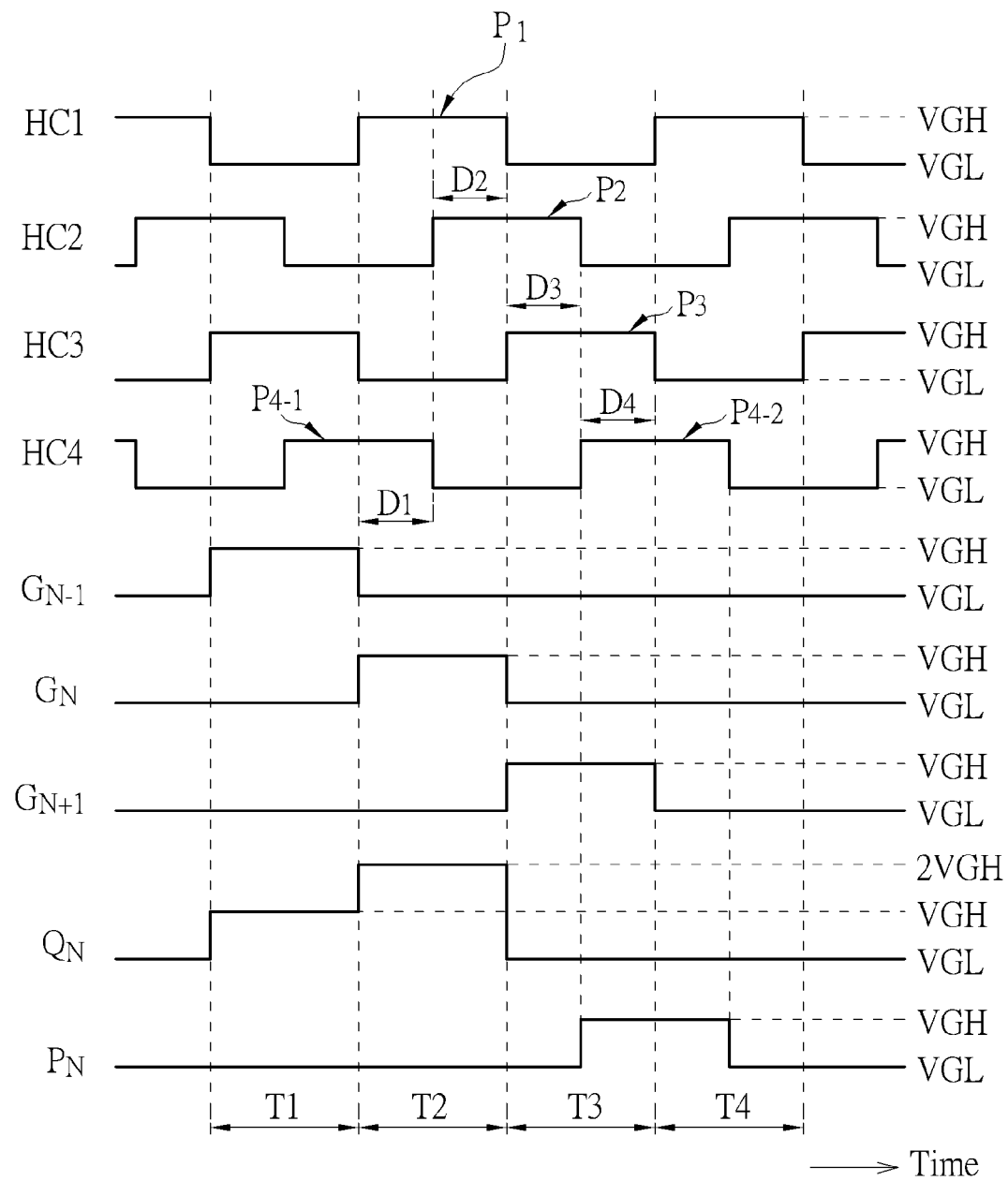
FIG. 5 shows a timing diagram of the gate driver in FIG. 4.

FIG. 5 is the timing diagram of the gate driver 400 in FIG. 4 according to one embodiment. FIG. 5 also shows the timing diagram of the clock signals HC1, HC2, HC3, and HC4. The clock signals HC1, HC2, HC3 and HC4 have the same period but different phases. The pulse $P_1$ of the clock signal HC1 overlaps with the pulse $P_{4-1}$ of the clock signal HC4 for a period of time $D_1$, and the pulse $P_1$ of the clock signal HC1 is behind of the pulse $P_{4-1}$ of the clock signal HC4 in time domain. The pulse $P_1$ of the clock signal HC1 overlaps with the pulse $P_2$ of the clock signal HC2 for a period of time $D_2$, and the pulse $P_1$ of the clock signal HC1 is ahead of the pulse $P_2$ of the clock signal HC2 in time domain. The pulse $P_2$ of the clock signal HC2 overlaps with the pulse $P_3$ of the clock signal HC3 for a period of time $D_3$, and the pulse $P_2$ of the clock signal HC2 is ahead of the pulse $P_3$ of the clock signal HC3 in time domain. The pulse $P_3$ of the clock signal HC3 overlaps with the pulse $P_{4-2}$ of the clock signal HC4 for a period of time $D_4$, and the pulse $P_3$ of the clock signal HC3 is ahead of the pulse $P_{4-2}$ of the clock signal HC4 in time domain. In one embodiment, each of the periods of time $D_1$ to $D_4$ is at least longer than the time for a source driver of a display panel to transmit one bit of the pixel information.

FIG. 5 is the timing diagram of the gate driver 400 in FIG. 4. To further explain the advantages and features of the shift register 300, please also refer to FIG. 3 as well. In the embodiment of FIG. 5, the first selective control signal U2D is kept at the high gate voltage VGH, and the second selective control signal D2U is kept at the low gate voltage VGL.

During the period T1, the clock signal HC1 is at the low gate voltage VGL, the clock signal HC2 is changing from the high gate voltage VGH to the low gate voltage VGL, the clock signal HC4 is changing from the low gate voltage VGL to the high gate voltage VGH, the gate driving signal $G_{N-1}$ is at the high gate voltage VGH, and the gate driving signal $G_{N+1}$ is at the low gate voltage VGL. During the period T1, the switch T3A is turned on and the switch T3B is turned off. The voltage level of the node $Q_N$ is pulled up to the high gate voltage VGH as the first selective control signal U2D, which turns on the switch T3C in the driving circuit 320. The gate driving signal $G_N$ is kept at the low gate voltage VGL as the clock signal HC1, and the switch T3D in the stability pull-down control circuit 330 is also turned on. Therefore, the voltage level of the second node $P_N$ is pulled down to the low gate voltage VGL, which turns off the switches T3H and T3I in the stability pull-down circuit 340. During the period T1, although the switch T3E in stability pull-down control circuit 330 may be turned on when the clock HC4 changes to the high gate voltage VGH, the voltage level of the second node $P_N$ can still remain at the low gate voltage VGL because the driving power of switch T3D is greater than the driving power of the switch T3E.

During the period T2, the clock signal HC1 is at the high gate voltage VGH, the clock signal HC2 is changing from the low gate voltage VGL to the high gate voltage VGH, the clock signal HC4 is changing from the high gate voltage VGH to the low gate voltage VGL, the gate driving signal $G_{N-1}$ is at the low gate voltage VGL, and the gate driving signal $G_{N+1}$ is at the low gate voltage VGL. During the period T2, the switches T3A and T3B in the pull-up circuit 310 are both turned off and the switch T3C in the driving circuit 320 is still turned on so the gate driving signal $G_N$ is pulled up to the high gate voltage VGH as the clock signal HC1. The voltage level of the first node $Q_N$ is pulled up to about 2 times the high gate voltage VGH due to the coupling effect of the capacitor C1. The switch T3D in the stability pull-down control circuit 330 is still turned on so the voltage level of the second node $P_N$ remains at the low gate voltage VGL, which turns off the switches T3H and T3I in the stability pull-down circuit 340. Similarly, during the period T2, although the switch T3E in stability pull-down control circuit 330 may be turned on when the clock HC4 is at the high gate voltage VGH, the voltage level of the second node $P_N$ can still remain at the low gate voltage VGL because the driving power of switch T3D is greater than the driving power of the switch T3E.

During the period T3, the clock signal HC1 is at the low gate voltage VGL, the clock signal HC2 is changing from the high gate voltage VGH to the low gate voltage VGL, the clock signal HC4 is changing from the low gate voltage VGL to the high gate voltage VGH, the gate driving signal $G_{N-1}$ is at the low gate voltage VGL, and the gate driving signal $G_{N+1}$ is at the high gate voltage VGH. During the period T3, the switch T3A is turned off and the switch T3B is turned on so the voltage level of the first node $Q_N$ and the gate driving signal $G_N$ are both pulled down to the low gate voltage VGL as the second selective control signal D2U. The switch T3C in the driving circuit 320 is turned off and the switch T3D in the stability pull-down control circuit 330 is also turned off. The switch T3E is changing from turned off to turned on during the period T3 according to the change of the clock HC4 and the switch T3F is changing from turned on to turned off during the period T3 according to the change of the clock HC2. Therefore, at the end of the period T3, the voltage level of the second node $P_N$ is pulled up to the high gate voltage VGH as the first selective control signal U2D by the turned-on switch T3E, which also turns on the switches T3H and T3I in the stability pull-down circuit 340 at the end of the period T3.

During the period T4, the clock signal HC1 is at the high gate voltage VGH, the clock signal HC2 is changing from the low gate voltage VGL to the high gate voltage VGH, the clock signal HC4 is changing from the high gate voltage VGH to the low gate voltage VGL, the gate driving signal $G_{N-1}$ is at the low gate voltage VGL, and the gate driving signal $G_{N+1}$ is at the low gate voltage VGH. During the period T4, the switches T3A and T3B are both turned off so the voltage level of the first node $Q_N$ remains at the low gate voltage VGL. Therefore, the switch T3C in the driving circuit 320 is turned off and the gate driving signal $G_N$ remains at the low gate voltage VGL. However, in the real case, a glitch may happen on the first node $Q_N$ due to the coupling effect of the parasitic capacitor of the switch T3C when the voltage level of the clock signal HC1 is changing between the high gate voltage VGH and the low gate voltage VGL. At this moment, since the switch T3D in the stability pull-down control circuit 330 is still turned off and the switch T3E is turned on from the end of the period T3 to the beginning of the period T4 according to the change of the clock HC4, the switch T3H is also turned on. Therefore, the glitch can be suppressed effectively and keep the voltage level of the first node QN at the low gate voltage VGL stable.

In one embodiment of the present invention, switches T3A to T3F, T3H and T3I can be N type transistors (ex, N-type TFT or N-type MOSFET), and the control terminal of each of the switches can be the gate of an N-type transistor. Therefore, the process of manufacturing the shift register according to the embodiments of the present invention can be simplified by using fewer masks In addition, in the explanation above, the clock signals HC1, HC2, HC3, and HC4 can also be called as the first clock signal, the third clock signal, the fourth clock signal and the second clock signal respectively. The shift register 300_1 can be called as the first shift register. The shift register 300_2 can be called as the second shift register. The shift register 300_3 can be called as the third shift register. The shift register 300_4 can be called as the fourth shift register. The capacitor C1 can also be called as the first capacitor. The switches T3A and T3B can be called as the first selective switch and the second selective switch. The switches T3C, T3D, T3H, T3I, T3E, and T3F can also be called as the fourth switch, the first switch, the fifth switch, the sixth switch, the second switch, and the third switch respectively.

In summary, according to the embodiments of the present invention, the stability pull-down control circuit of the shift register can help to provide a discharging path at the first node before the clock signal received from the first input terminal changes to the high gate voltage according to the two clock signals received from the second input terminal and the third input terminal. Thus, the glitch generated on the first node caused by the coupling effect of the parasitic capacitor of the transistor in the driving circuit can be suppressed effectively and instantly. Consequently, the correctness of the waveform of the gate driving signal outputted by the shift register can be preserved and the wrong charging of the pixels driven by the wrong gate driving signal can also be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register comprising:
   a first input terminal configured to receive a first clock signal;
   a second input terminal configured to receive a second clock signal;
   a third input terminal configured to receive a third clock signal;
   a first input signal terminal configured to receive a first input signal;
   a second input signal terminal configured to receive a second input signal;
   a pull-up circuit coupled to a first node, the first input signal terminal and the second input signal terminal for pulling up a voltage level of the first node according to the first input signal, the second input signal, a first selective control signal, and a second selective control signal;

a driving circuit coupled to the first input terminal, an output terminal of the shift register, and the first node for controlling an electrical connection between the first input terminal and the output terminal according to the voltage level of the first node;

a stability pull-down control circuit comprising:
  a first switch having a first terminal coupled to a second node of the shift register, a second terminal coupled to a system voltage terminal of the shift register, and a control terminal coupled to the first node;
  a second switch having a first terminal configured to receive the first selective control signal, a second terminal coupled to the second node, and a control terminal coupled to the second input terminal; and
  a third switch having a first terminal configured to receive the second selective control signal, a second terminal coupled to the second node, and a control terminal coupled to the third input terminal; and a stability pull-down circuit coupled to the first node, the second node, the output terminal and the system voltage terminal for controlling an electrical connection between the first node and the output terminal and an electrical connection between the output terminal and the system voltage terminal according to a voltage level of the second node.

2. The shift register of claim 1, wherein the pull-up circuit comprises:
  a first selective switch having a first terminal configured to receive the first selective control signal, a second terminal coupled to the first node, and a control terminal coupled to the first input signal terminal; and
  a second selective switch having a first terminal configured to receive the second selective control signal, a second terminal coupled to the first node, and a control terminal coupled to the second input signal terminal.

3. The shift register of claim 1, wherein:
  the first clock signal and the second clock signal have a same period and different phases, a pulse of the first clock signal overlaps with a pulse of the second clock signal, the pulse of the first clock signal is behind of the pulse of the second clock signal in time domain; and
  the first clock signal and the third clock signal have the same period and different phases, the pulse of the first clock signal overlaps with a pulse of the third clock signal, the pulse of the first clock signal is ahead of the pulse of the third clock signal in time domain.

4. The shift register of claim 1, wherein when the first selective control signal is at a high gate voltage, the second selective control signal is at a low gate voltage, the voltage level of the first node is at the low gate voltage, the second clock signal is at the high gate voltage and the third clock signal is at the low gate voltage:
  the stability pull-down control circuit pulls up the voltage level of the second node to the high gate voltage; and
  the stability pull-down circuit keeps the voltage level of the first node and a voltage level of the output terminal at the low gate voltage according to the voltage level of the second node for avoiding a glitch on the first node caused by a change of the first clock signal.

5. The shift register of claim 1, wherein the driving circuit comprises:

a fourth switch having a first terminal coupled to the first input terminal, a second terminal coupled to the output terminal, and a control terminal coupled to the first node; and a capacitor coupled between the first node and the output terminal.

6. The shift register of claim 1, wherein the stability pull-down circuit comprises:
  a fifth switch having a first terminal coupled to the first node, a second terminal coupled to the output terminal, and a control terminal coupled to the second node; and
  a sixth switch having a first terminal coupled to the output terminal, a second terminal coupled to the system voltage terminal, and a control terminal coupled to the second node.

7. A gate driver comprising a plurality of shift registers, wherein each shift register comprises:
  a first input terminal;
  a second input terminal;
  a third input terminal;
  a first node;
  a second node;
  a first input signal terminal;
  a second input signal terminal;
  a system voltage terminal;
  a pull-up circuit coupled to the first node, the first input signal terminal and the second input signal terminal for pulling up a voltage level of the first node according to a voltage level of the first input terminal signal terminal, a voltage level of the second input signal terminal, a first selective control signal, and a second selective control signal;
  a driving circuit coupled to the first input terminal, an output terminal of the shift register, and the first node for controlling an electrical connection between the first input terminal and the output terminal according to the voltage level of the first node;
  a stability pull-down control circuit comprising:
    a first switch having a first terminal coupled to a second node of the shift register, a second terminal coupled to the system voltage terminal of the shift register, and a control terminal coupled to the first node;
    a second switch having a first terminal configured to receive the first selective control signal, a second terminal coupled to the second node, and a control terminal coupled to the second input terminal; and
    a third switch having a first terminal configured to receive the second selective control signal, a second terminal coupled to the second node, and a control terminal coupled to the third input terminal; and
  a stability pull-down circuit coupled to the first node, the second node, the output terminal and the system voltage terminal for controlling an electrical connection between the first node and the output terminal and an electrical connection between the output terminal and the system voltage terminal according to a voltage level of the second node.

8. The gate driver of claim 7, wherein the pull-up circuit comprises:
  a first selective switch having a first terminal configured to receive the first selective control signal, a second terminal coupled to the first node, and a control terminal coupled to the first input signal terminal; and
  a second selective switch having a first terminal configured to receive the second selective control signal, a second terminal coupled to the first node, and a control terminal coupled to the second input signal terminal.

9. The gate driver of claim 7, wherein the driving circuit comprises:
a fourth switch having a first terminal coupled to a first input terminal, a second terminal coupled to the output terminal of the shift register, and a control terminal coupled to the first node; and
a capacitor coupled between the first node and the output terminal.

10. The gate driver of claim 7, wherein:
the plurality of shift registers comprises a first shift register, a second shift register, a third shift register and a fourth shift register;
the first input terminal of the first shift register receives a first clock signal, the second input terminal of the first shift register receives a second clock signal, the third input terminal of the first shift register receives a third clock signal, and the second input signal terminal of the first shift register is coupled to an output terminal of the second shift register;
the first input terminal of the second shift register receives the third clock signal, the second input terminal of the second shift register receives the first clock signal, the third input terminal of the second shift register receives a fourth clock signal, the first input signal terminal of the second shift register is coupled to an output terminal of the first shift register, and the second input signal terminal of the second shift register is coupled to an output terminal of the third shift register;
the first input terminal of the third shift register receives the fourth clock signal, the second input terminal of the third shift register receives the third clock signal, the third input terminal of the third shift register receives the second clock signal, the first input signal terminal of the third shift register is coupled to the output terminal of the second shift register, and the second input signal terminal of the third shift register is coupled to an output terminal of the fourth shift register; and
the first input terminal of the fourth shift register receives the second clock signal, the second input terminal of the fourth shift register receives the fourth clock signal, the third input terminal of the fourth shift register receives the first clock signal, and the first input signal terminal of the fourth shift register is coupled to the output terminal of the third shift register.

11. The gate driver of claim 10, wherein:
the first clock signal and the second clock signal have a same period and different phases, a pulse of the first clock signal overlaps with a first pulse of the second clock signal, the pulse of the first clock signal is behind of the first pulse of the second clock signal in time domain;
the first clock signal and the third clock signal have the same period and different phases, the pulse of the first clock signal overlaps with a pulse of the third clock signal, the pulse of the first clock signal is ahead of the pulse of the third clock signal in time domain;
the third clock signal and the fourth clock signal have the same period and different phases, the pulse of the third clock signal overlaps with a pulse of the fourth clock signal, the pulse of the third clock signal is ahead of the pulse of the fourth clock signal in time domain; and
the fourth clock signal and the second clock signal have the same period and different phases, a pulse of the fourth clock signal overlaps with a second pulse of the second clock signal, the pulse of the fourth clock signal is ahead of the second pulse of the second clock signal in time domain.

12. The gate driver of claim 10, wherein when the first selective control signal is at a high gate voltage, the second selective control signal is at a low gate voltage, a voltage level of the first node of the first shift register is at the low gate voltage, the second clock signal is at the high gate voltage, and the third clock signal is at the low gate voltage:
the stability pull-down control circuit of the first shift register pulls up a voltage level of the second node of the first shift register to the high gate voltage; and
the stability pull-down circuit of the first shift register keeps the voltage level of the first node of the first shift register and a voltage level of the output terminal of the first shift register at the low gate voltage according to the voltage level of the second node of the first shift register for avoiding a glitch on the first node of the first shift register caused by a change of the first clock signal.

13. The gate driver of claim 10, wherein when the first selective control signal is at a high gate voltage, the second selective control signal is at a low gate voltage, a voltage level of the first node of the second shift register is at the low gate voltage, the first clock signal is at the high gate voltage, and the fourth clock signal is at the low gate voltage:
the stability pull-down control circuit of the second shift register pulls up a voltage level of the second node of the second shift register to the high gate voltage; and
the stability pull-down circuit of the second shift register keeps the voltage level of the first node of the second shift register and a voltage level of the output terminal of the second shift register at the low gate voltage according to the voltage level of the second node of the second shift register for avoiding a glitch on the first node of the second shift register caused by a change of the third clock signal.

14. The gate driver of claim 10, wherein when the first selective control signal is at a high gate voltage, the second selective control signal is at a low gate voltage, a voltage level of the first node of the third shift register is at the low gate voltage, the third clock signal is at the high gate voltage, and the second clock signal is at the low gate voltage:
the stability pull-down control circuit of the third shift register pulls up a voltage level of the second node of the third shift register to the high gate voltage; and
the stability pull-down circuit of the third shift register keeps the voltage level of the first node of the third shift register and a voltage level of the output terminal of the third shift register at the low gate voltage according to the voltage level of the second node of the third shift register for avoiding a glitch on the first node of the third shift register caused by a change of the fourth clock signal.

15. The gate driver of claim 10, wherein when the first selective control signal is at a high gate voltage, the second selective control signal is at a low gate voltage, a voltage level of the first node of the fourth shift register is at the low gate voltage, the fourth clock signal is at the high gate voltage, and the first clock signal is at the low gate voltage:
the stability pull-down control circuit of the fourth shift register pulls up a voltage level of the second node of the fourth shift register to the high gate voltage; and
the stability pull-down circuit of the fourth shift register keeps the voltage level of the first node of the fourth shift register and a voltage level of the output terminal of the fourth shift register at the low gate voltage according to the voltage level of the second node of the fourth shift register for avoiding a glitch on the first node of the fourth shift register caused by a change of the second clock signal.

* * * * *